US007456880B2

(12) United States Patent
Okita et al.

(10) Patent No.: US 7,456,880 B2
(45) Date of Patent: Nov. 25, 2008

(54) PHOTOELECTRIC CONVERSION ELEMENT HAVING A PLURALITY OF SEMICONDUCTOR REGIONS AND INCLUDING CONDUCTIVE LAYERS PROVIDED ON EACH ISOLATION ELEMENT REGION

(75) Inventors: Akira Okita, Yamato (JP); Masanori Ogura, Atsugi (JP); Takanori Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 687 days.

(21) Appl. No.: 11/214,834

(22) Filed: Aug. 31, 2005

(65) Prior Publication Data
US 2006/0044434 A1    Mar. 2, 2006

(30) Foreign Application Priority Data
Sep. 1, 2004    (JP)    ............... 2004-254361

(51) Int. Cl.
*H04N 9/64* (2006.01)
(52) U.S. Cl. ...................... 348/243; 348/294
(58) Field of Classification Search ............... 348/243, 348/294; 257/233, 444, 446, 448, 450, 459, 257/463, 523, 349, 292, 225
See application file for complete search history.

(56) References Cited

U.S. PATENT DOCUMENTS

| 4,663,669 A | 5/1987 | Kinoshita et al. ...... 358/213.19 |
| 4,774,585 A | 9/1988 | Suga et al. ............. 358/213.19 |
| 4,780,764 A | 10/1988 | Kinoshita et al. ...... 358/213.19 |
| 4,821,105 A | 4/1989 | Suga et al. ............. 358/213.19 |
| 4,929,994 A | 5/1990 | Matsumoto |
| 5,016,108 A * | 5/1991 | Akimoto et al. ............. 348/302 |
| 5,121,225 A | 6/1992 | Murata et al. ................ 358/471 |
| 5,261,013 A | 11/1993 | Murata et al. .................. 382/65 |
| 5,475,211 A | 12/1995 | Ogura et al. ............. 250/208.1 |
| 6,281,533 B1 * | 8/2001 | Miyagawa et al. .......... 257/290 |
| 6,423,993 B1 * | 7/2002 | Suzuki et al. ................ 257/292 |

(Continued)

FOREIGN PATENT DOCUMENTS

EP    1 017 106 A2    7/2000

(Continued)

OTHER PUBLICATIONS

Nakamura et al., "Amplified solid-state image element AMI (Amplified MOS Intelligent Imager)", Bulletin of Television Society, 41, 11, pp. 1075-1082, Nov. 1987.

(Continued)

*Primary Examiner*—Tuan Ho
*Assistant Examiner*—Gary C Vieaux
(74) *Attorney, Agent, or Firm*—Fitzpatrick, Cella, Harper & Scinto (57) ABSTRACT

To provide a solid-state image pickup apparatus with little or no difference in the dark currents between adjacent photoelectroc conversion elements and providing a high sensitivity and a low dark current even in-a high-speed readout operation.

A well is formed on a wafer, and diffusion layers are formed in the well to constitute a photodiode. A well contact is formed between the diffusion layers. Element isolation regions are provided between the well contact and the diffusion layers, and conductive layers are provided respectively on the element isolation regions, thereby reducing a difference in the minority carrier diffusions from the well contact to the photodiodes (diffusion layers).

9 Claims, 7 Drawing Sheets

U.S. PATENT DOCUMENTS

| | | | |
|---|---|---|---|
| 6,657,665 B1 | 12/2003 | Guidash | 348/308 |
| 6,731,337 B2 | 5/2004 | Watanabe | 348/308 |
| 6,774,453 B2 * | 8/2004 | Okita | 257/506 |
| 6,960,751 B2 * | 11/2005 | Hiyama et al. | 250/208.1 |
| 7,016,089 B2 | 3/2006 | Yoneda | 358/482 |
| 2001/0012133 A1 | 8/2001 | Yoneda et al. | 358/482 |
| 2005/0098805 A1 | 5/2005 | Okita et al. | 257/292 |
| 2005/0122418 A1 | 6/2005 | Okita et al. | 348/340 |
| 2005/0168618 A1 | 8/2005 | Okita et al. | 348/335 |
| 2005/0174552 A1 | 8/2005 | Takada et al. | 355/53 |
| 2005/0179796 A1 | 8/2005 | Okita et al. | 348/308 |
| 2005/0269604 A1 | 12/2005 | Koizumi et al. | 257/291 |
| 2006/0027843 A1 | 2/2006 | Ogura et al. | 257/291 |
| 2006/0043261 A1 | 3/2006 | Matsuda et al. | 250/208.1 |
| 2006/0043393 A1 | 3/2006 | Okita et al. | 357/93 |
| 2006/0043440 A1 | 3/2006 | Hiyama et al. | 257/291 |
| 2006/0044434 A1 | 3/2006 | Okita et al. | 348/294 |
| 2006/0044439 A1 | 3/2006 | Hiyama et al. | 348/308 |
| 2006/0061674 A1 | 3/2006 | Iida et al. | 348/308 |
| 2006/0157759 A1 | 7/2006 | Okita et al. | 257/292 |
| 2006/0158539 A1 | 7/2006 | Koizumi et al. | 348/300 |
| 2006/0158543 A1 | 7/2006 | Ueno et al. | 348/308 |

FOREIGN PATENT DOCUMENTS

| | | |
|---|---|---|
| JP | 2000-232216 | 8/2000 |
| JP | 2001-230400 | 8/2001 |
| JP | 2001-332714 | 11/2001 |

OTHER PUBLICATIONS

A. Yusa et al., "SIT Image Sensor: Design Considerations and Characteristics", IEEE Trans, vol. ED-33, pp. 735-742, (Jun. 1986).

Tanaka et al., 37 A 310K Pixel Bipolar Imager (BASIS), IEEE Trans, vol. 37, No. 4 (Apr. 1990) pp. 964-971.

J. Hynecek, "A New Device Architecture Suitable for High-Resolution and High-Performance Image Sensors", IEEE Trans, vol. 35. No. 5, (May 1988) pp. 646-652.

* cited by examiner

PHOTOELECTRIC CONVERSION ELEMENT HAVING A PLURALITY OF SEMICONDUCTOR REGIONS AND INCLUDING CONDUCTIVE LAYERS PROVIDED ON EACH ISOLATION ELEMENT REGION

BACKGROUND OF THE INVENTION

1. Field of the Invention

The present invention relates to an image pickup apparatus and a system utilizing the same, and more particularly to an image pickup apparatus and a system such as a digital camera, a video camera, a copying apparatus, and a facsimile apparatus.

2. Related Background Art

A solid-state image pickup apparatus formed by a one- or two-dimensional array of photoelectroc conversion elements such as photodiodes is widely employed in a digital camera, a video camera, a copying apparatus, a facsimile apparatus and the like. The solid-state image pickup apparatus includes a CCD image pickup device and an amplifying solid-state image pickup apparatus represented by a CMOS sensor which is formed integrally with peripheral circuits by a CMOS process.

Such solid-state image pickup apparatus shows a trend toward a larger number of pixels, with a decrease in the area of a photodiode, as a result of a reduction in the area of a pixel. It is therefore required to handle a signal charge of a smaller amount, and it is therefore required to reduce a dark current constituting a noise component, and to increase an effective area of the photodiode. For such purpose, EP 1017106A1 discloses in FIG. 4 (corresponding to Japanese Patent Application Laid-open No. 2000-232216) a configuration in which floating diffusion regions formed for every pixels are connected by a conductor, and in which the signal reading is executed by an amplification by a common amplifying MOS transistor, thereby reducing a number of transistors per unit pixel and maintaining the area of the photodiode larger.

Also when the solid-state image pickup apparatus becomes larger in the area, it becomes necessary, as disclosed in Japanese Patent Application Laid-open No. 2001-332714 (FIGS. 7 and 10) or Japanese Patent Application Laid-open No. 2001-230400 (FIGS. 1 and 16, corresponding to US 2001-1012133A) to form a well contact in order to obtain a firm substrate potential for the photodiode and the transistor and to suppress a shading phenomenon.

The present inventor has found that, in case of positioning a well contact between adjacent pixels, the dark current may become different between the adjacent pixels depending on a layout of conductive layers constituting electrodes and wirings.

Therefore, an object of the present invention is to provide a photoelectric conversion apparatus, a solid-state image pickup apparatus and a solid-state image pickup system, showing little difference in the dark currents in case of providing a well contact between adjacent pixels.

SUMMARY OF THE INVENTION

The present invention provides an image pickup apparatus including a plurality of a photoelectric conversion element which has a first semiconductor region of a first conductive type, and a second semiconductor region of a second conductive type forming a junction with the first semiconductor region, and a third semiconductor region of a first conductive type, provided in the first semiconductor region between the mutually adjacent second semiconductor regions, containing:

An element isolation region respectively provided between the third semiconductor region and each of the mutually adjacent second semiconductor regions; and a conductive layer provided on each element isolation region.

The image pickup system of the present invention employs the aforementioned image pickup apparatus of the present invention.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

In the following, embodiments of the present invention will be explained in detail with reference to the accompanying drawings.

First Embodiment

Figure 1:
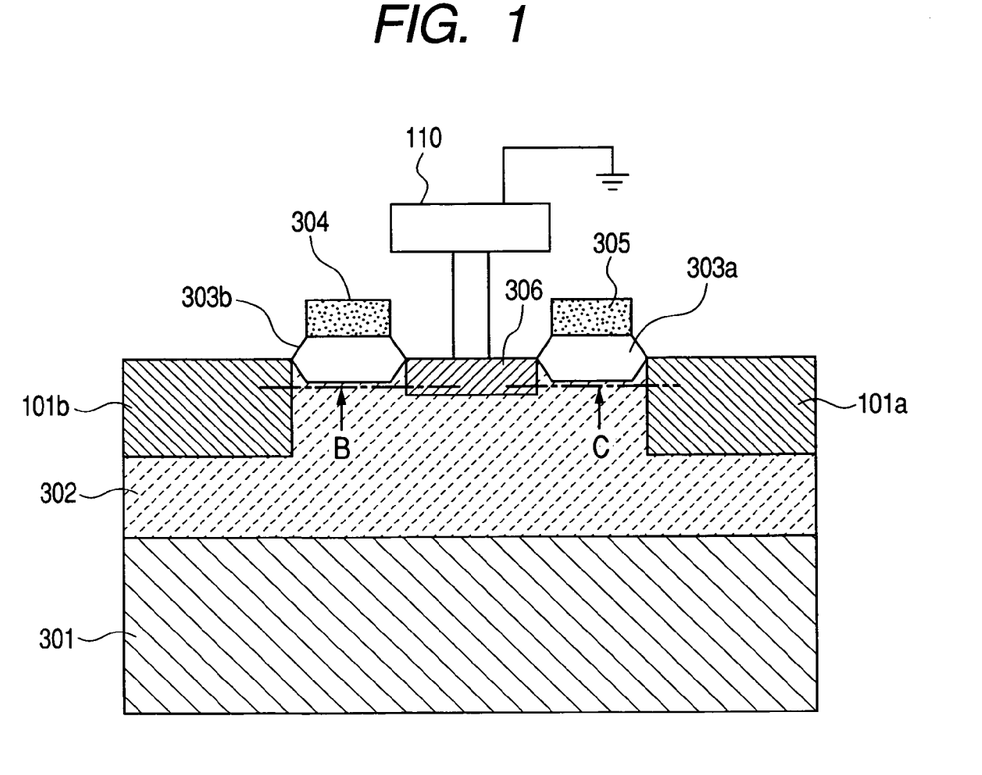
FIG. 1 is a cross-sectional view of a first embodiment of a photoelectric conversion apparatus and a solid-state image pickup apparatus of the present invention.

FIG. 1 is a cross-sectional view showing a first embodiment of an image pickup apparatus of the present invention. In FIG. 1, there are shown a semiconductor substrate 301 for example of N type; a P-type well (first semiconductor region of first conductive type) 302; N-type diffusion regions (second semiconductor regions of second conductive type) 101$a$, 101$b$ capable of accumulating a signal charge and forming junctions with the well 302 to constitute photodiodes serving as a photoelectroc conversion element; element isolation regions 303$b$, 303$a$ formed for example by a LOCOS (local oxidation of silicon) film; and polysilicon wiring layers 304, 305 constituting conductive layers provided on the element isolation regions 303$b$, 303$a$. A well contact defines a potential of the P-type well 302 through a P$^+$ diffusion region (third semiconductor region of first conductive type), connected to a fixed voltage source by a wiring through a contact hole. The contact is represented as a well contact, but it becomes a substrate contact in case N-type diffusion regions 101a, 101b are provided directly on the wafer.

In case the wiring layer 304 is absent on the element isolation region 303b between the diffusion region 101b and the diffusion region 306 and the wiring layer 305 is provided on the element isolation region 303a between the diffusion region 101a and the diffusion region 306, the diffusions of the minority carriers from the well contact-to the N-diffusion regions 101a and 101b become mutually different. This is because, depending on the difference in the work functions of the wiring material and the well, a potential form becomes different between a part where a wiring layer is present and a part where a wiring layer is absent, namely between portions B and C in FIG. 1. Because of this phenomenon, the diffusion of the minority carriers from the well contact to the photodiodes becomes different, though slightly.

Figure 2:
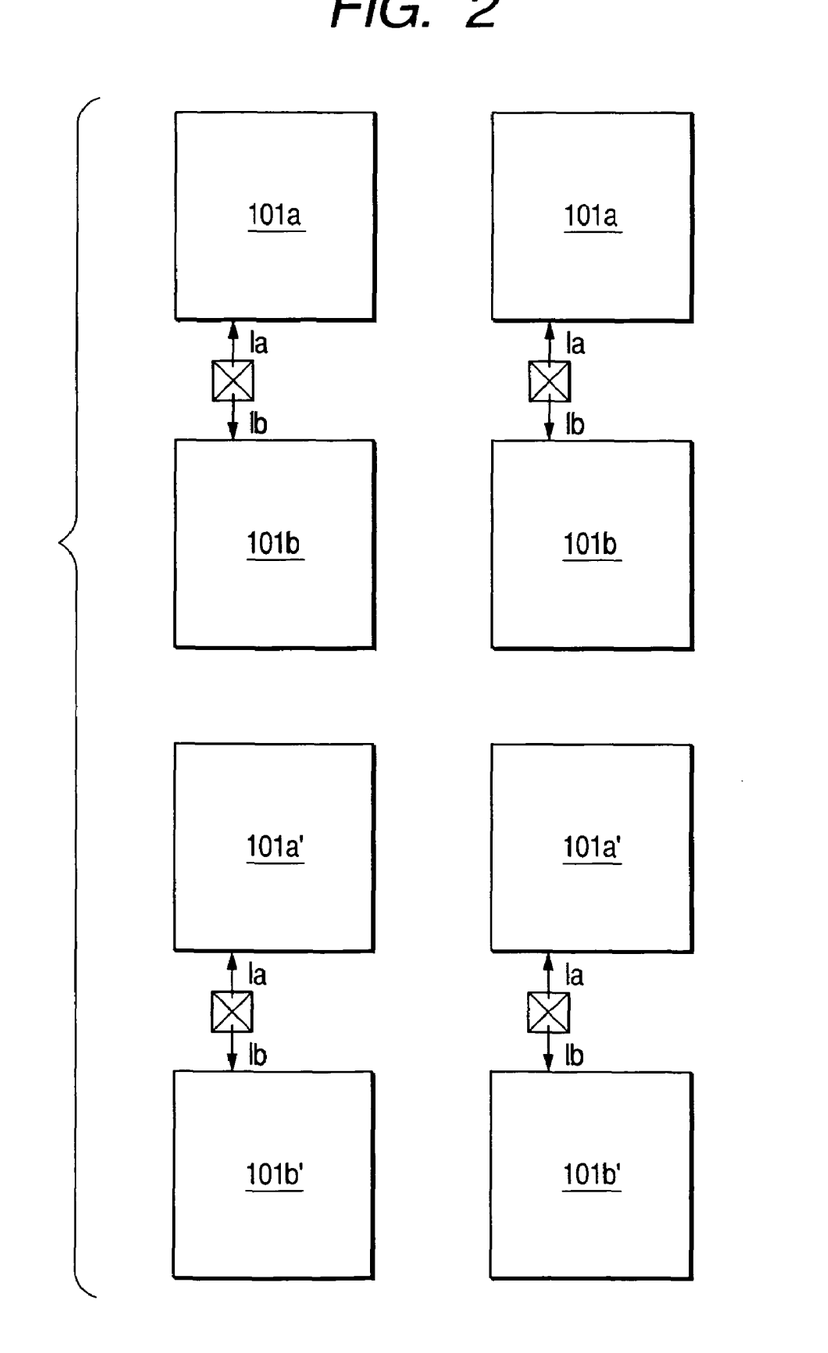
FIG. 2 is a plan view of a solid-state image pickup apparatus of the present invention.

Now, let us consider an image pickup apparatus in which the diffusion regions 101a, 101b constituting photodiodes of a pixel are arranged two-dimensionally, and two pixels are formed as a group (101a and 101b constituting a group, and 101a' and 101b' constituting another group), and a well contact is provided for two pixels (of a group) and in a position between the pixels (within a group). Minority carriers Ia flow from the well contact to the diffusion regions 101a, 101a' of the pixels in first and third rows, and minority carriers Ib flow from the well contact to the diffusion regions 101b, 101b' of the pixels in second and fourth rows. In case of the aforementioned difference in the diffusions of the minority carriers as described above, the amounts of the minority carriers Ia and the minority carriers Ib become mutually different to result in an unevenness in the dark currents in odd row and even row. Such difference results in a striped noise in every other row, thereby deteriorating the image quality. Such phenomenon becomes particularly conspicuous in case of a charge accumulation for a number of seconds.

In the present embodiment, wiring layers 304, 305 serving as conductive layers are provided on the element isolation regions between the well contact area and the photodiodes, to obtain uniform diffusions of the minority carriers or diffusion with little difference, thereby realizing an image pickup apparatus with no or little unevenness in the dark currents.

Also the dark currents can be matched in case the distances between the P$^+$-diffusion region 306 and the diffusion regions 101b and 101a are mutually same. In the foregoing there has been explained a situation of a diffusion region in the well contact, but this is not limited to a well contact region and a similar situation applies to a region of a high impurity concentration having a same conductive type as the surrounding well.

The wiring layers 304, 305 are preferably formed with a same material (for example polysilicon), in order that the difference in the work functions between the wiring material and the well becomes equal between the portions C and B in FIG. 1. However, the wiring layers 304, 305 may be formed by different materials as long as the diffusions of the minority carriers from the well contact to the photodiodes (diffusion regions) have a smaller difference between the portions C and B in FIG. 1, in comparison with a case where either wiring layer is not provided.

FIG. 2 shows a case of grouping two pixels, but 3 or more pixels may be formed as a group. In such case, the well contact may be provided in plural units, according to the number of pixels constituting a group.

Figure 4:
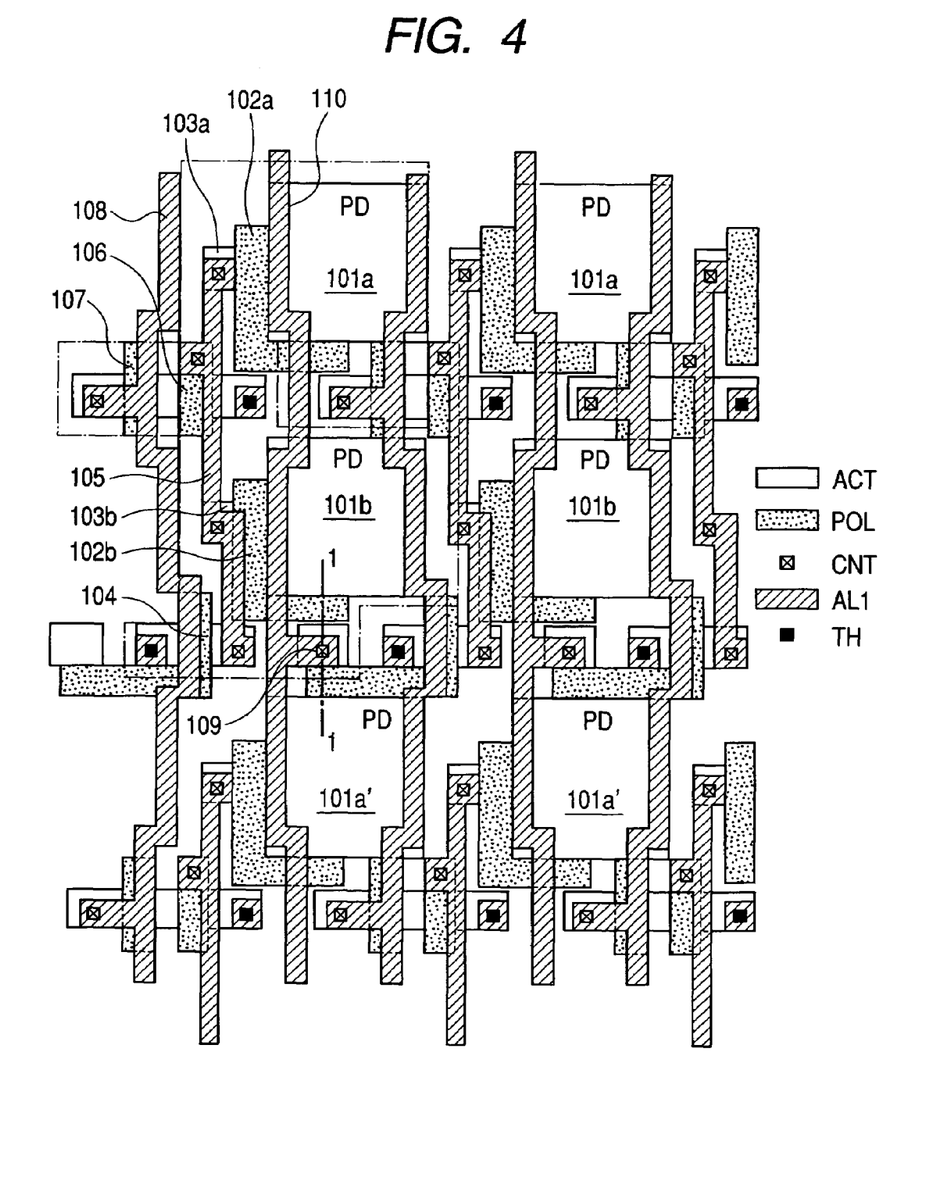
FIG. 4 is a plan view of a first embodiment of a solid-state image pickup apparatus of the present invention.

In case the configuration of the photoelectric conversion apparatus shown in FIG. 1 is applied for example to an amplifying solid-state image pickup apparatus such as a CMOS sensor as shown in FIG. 4, The wiring layers 304, 305 may be employed as wirings of transistors provided in the pixel region. For example, they may be applied as a gate electrode 102a of a transfer MOS transistor for a signal transfer from the photodiodes (diffusion regions 101a, 101b etc.), a gate electrode 107 of a selecting MOS transistor, a gate electrode 104 of a reset MOS transistor, or a gate electrode 106 of an amplifying MOS transistor. In particular, the wiring layers 304 and 305 may be applicable to a combination of a gate electrode 102a of a transfer MOS transistor and a gate electrode 104 of a reset MOS transistor, a combination of a gate electrode 102a of a transfer MOS transistor and a gate electrode 107 of a transfer MOS transistor, or a combination of a gate electrode 107 of a selecting MOS transistor and a gate electrode 104 of a reset MOS transistor. FIG. 4 shows a configuration in which the amplifying MOS transistor is used in common for plural pixels, and the selecting MOS transistor and the reset MOS transistor are also used in common for plural pixels. It is also applicable to a case where each pixel is provided with an amplifying MOS transistor, a selecting MOS transistor and a reset MOS transistor. The wiring layers 304, 305 may be utilized in a gate electrode 102a of a transfer MOS transistor, a gate electrode 107 of a selecting MOS transistor, a gate electrode 104 of a reset MOS transistor or a gate electrode 106 of an amplifying MOS transistor.

The configuration of the present embodiment of the present invention is advantageously applicable to a case where signal charges from the photodiodes are read through a floating diffusion region provided independently for each photoelectroc conversion element and are amplified by a common amplifying MOS transistor.

Now let us consideration a configuration in which an amplifying MOS transistor is used in common for two pixels, as described in EP1017106. In such case, if a well contact is not used, a long time is required for stabilizing the substrate potential in order to increase the drive rate at the readout operation, so that a high-speed readout is difficult to achieve.

On the other hand, a well contact formed for each pixel results in a corresponding decrease of the photodiode area, thereby reducing the effect of using the pixels in common. It is therefore possible to form a well contact for plural pixels, and to adopt the configuration of the present embodiment in order to solve the drawback of a difference in the dark currents between the pixel rows (rows of photodiodes).

Figure 7:
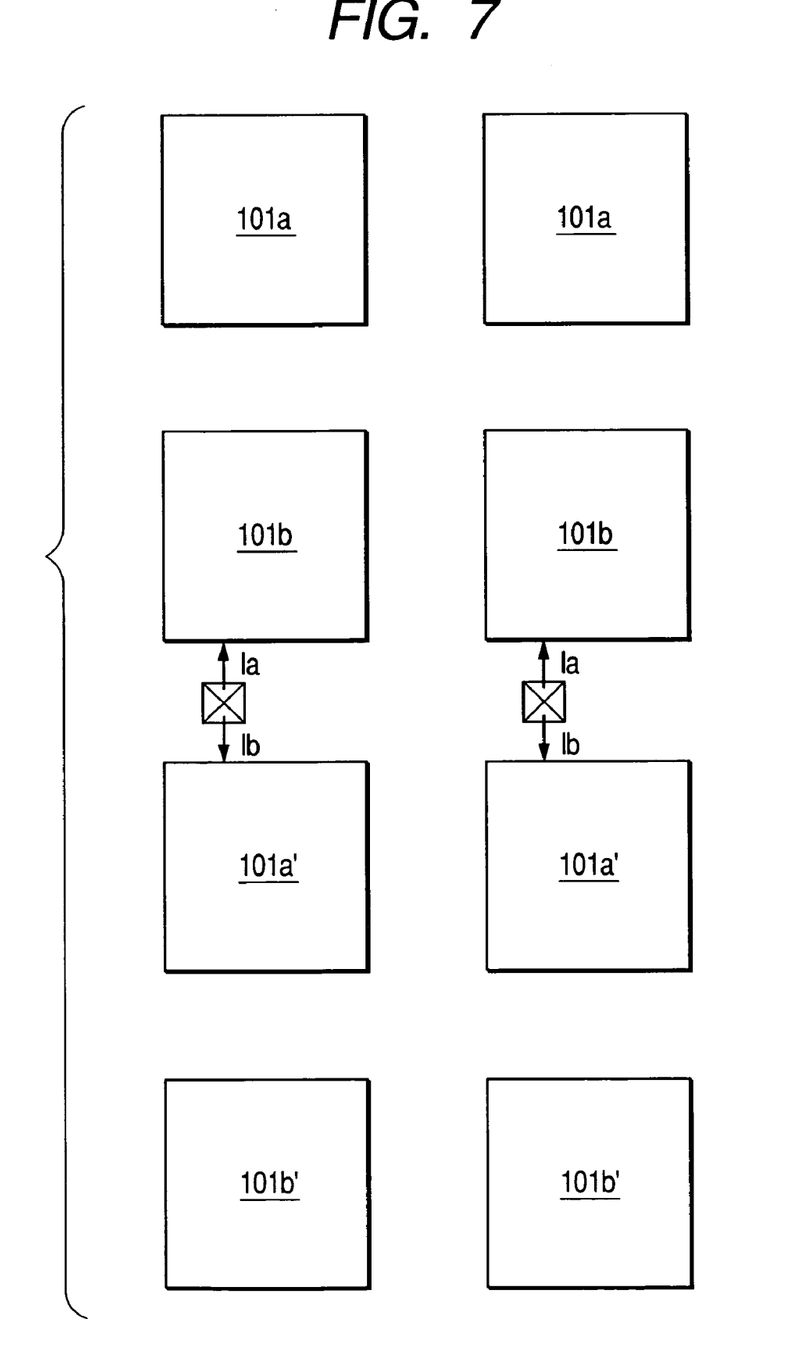
FIG. 7 is a plan view of a solid-state image pickup apparatus of the present invention.

It is also possible, as shown in FIG. 7, to form a first group by pixels 101a, 101b having a common amplifying MOS transistor, and a second group by pixels 101a', 101b' having a common amplifying MOS transistor. A well contact is provided between the pixels of the first group and the adjacent pixels of the second group. Thus, it may be provided in a first semiconductor region (well region), between the second semiconductor region in the first group and the second semiconductor region in the second group, adjacent to the second semiconductor region in the first group. Particularly in a configuration in which an amplifying MOS transistor is used in common by plural pixels as shown in FIG. 4, it is preferably formed between the pixels 101b and 101a' of the adjacent groups, in consideration of ease of layout. FIG. 4 shows an example in which the amplifying MOS transistor are used in common for two pixels which form a group, but it is also possible to use the amplifying MOS transistor in common for three or more pixels and to form a group by such three or more pixels. In such case, the well contact may be provided not only between the groups but also within a group.

Second Embodiment

Figure 3:
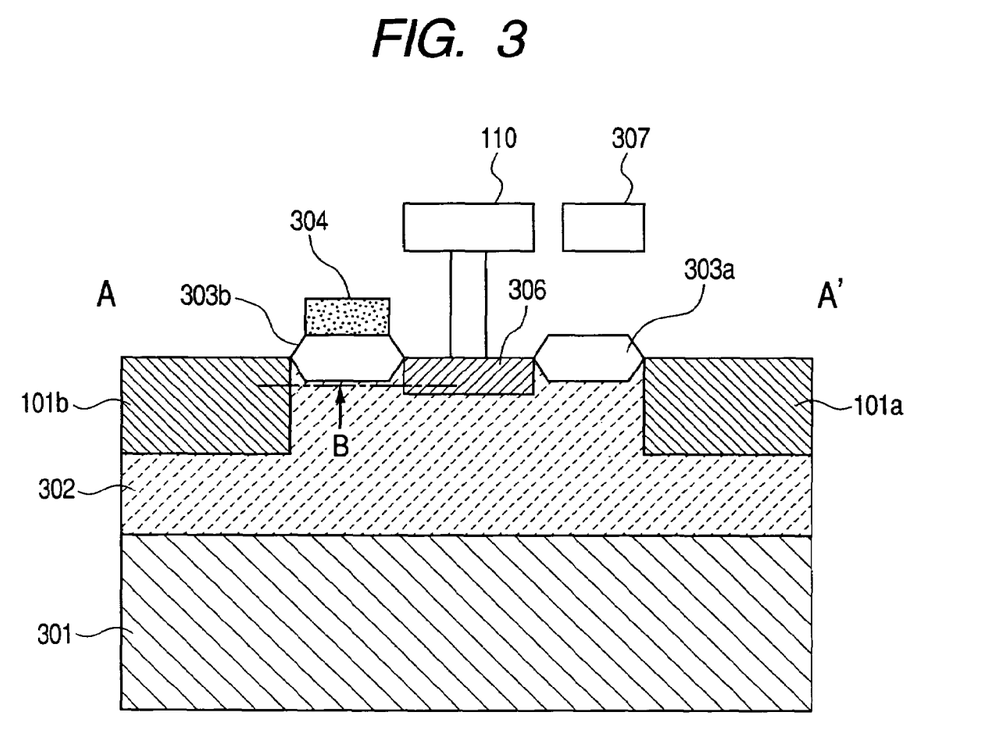
FIG. 3 is a cross-sectional view of a photoelectric conversion apparatus of the present invention.

The foregoing first embodiment shows an example in which the wiring layer constituting the conductive layer is formed by a same polysilicon layer, but different wiring layers may be provided on the element isolation region. As shown in FIG. 3, a wiring layer 304 of polysilicon is provided on the element isolation region 303b, and a wiring layer 307 of a metal material is formed on the element isolation region 303a, across an insulation layer. Such configuration allows, in comparison with a case where the wiring layer is formed only on one of the element isolation regions, to reduce a difference in the diffusion amounts of the minority carriers, thereby realizing a photoelectric conversion apparatus or a solid-state image pickup apparatus with a reduced unevenness in the dark currents. The wiring layer provided on the element isolation region can be a gate wiring of a transfer MOS transistor, a gate wiring of a selecting MOS transistor, or a gate wiring of a reset MOS transistor. Each wiring, though not illustrated, can be so provided as to perpendicular to a signal line 108 or a power supply wiring 110 such as a GND wiring shown in FIG. 4 and as to pass over the element isolation regions 303a, 303b.

As explained in the foregoing, the present invention is to reduce or to eliminate a difference in the dark currents in the adjacent photoelectroc conversion elements, and is applicable to a photoelectric conversion apparatus having a well contact or a substrate contact between the two photoelectroc conversion elements, more specifically applicable to a line sensor or an area sensor, in which the photoelectric conversion devices are arranged one- or two-dimensionally.

In the following, examples of the present invention will be explained.

EXAMPLE 1

FIG. 4 is a plan view of a first example of the present invention. In FIG. 4, there are shown a photodiode (diffusion layer) PD, an active region ACT, a polysilicon layer POL, a contact hole CNT, a first metal layer AL1 such as of aluminum, and a through hole TH.

In FIG. 4, there are shown N-diffusion layers 101a, 101b, 101a' constituting carrier accumulation layers of photodiode for photoelectric conversion; gate electrodes 102a, 102b of transfer MOS transistors for reading signal charges from photodiodes (N-diffusion layers) 101a, 101b; drain regions 103a, 103b (constituting floating diffusion regions (FD)) of the transfer MOS transistors; a gate electrode 104 of a reset transistor for resetting the photodiode (N-diffusion layer) and the FD region, and a gate electrode 106 of an amplifying MOS transistor constituting a source follower amplifier for converting the read charge into a voltage. The gate electrode of the amplifying MOS transistor and the FD regions 103a, 103b are connected by a wiring 105. A gate electrode 107 of a row selecting MOS transistor selectively outputs, to a signal line 108, an output of the amplifying MOS transistor constituting a source follower amplifier. A well contact 109 of the pixel region is fixed at a constant potential, for example a ground potential, through a power supply wiring 110 (connected to a fixed voltage source (including a case of grounding)). In FIG. 4, an area surrounded by a chain line indicates a pixel unit constituted of two photodiodes (N-diffusion regions), two transfer MOS transistors, two FD regions, an amplifying MOS transistor, a reset MOS transistor and a selecting MOS transistor. The two photodiodes constitute a group, and m groups are formed in case the photodiodes are provided in a number 2m (m being a natural number equal to or larger than 1) in the row direction. In case a group is formed by four photodiodes, there are formed m/2 groups in case the photodiodes are provided in a number 2m (m being a natural number equal to or larger than 2) in the row direction. A pixel unit is constituted by providing a transfer MOS transistor for each photodiode, and providing an amplifying MOS transistor, a reset MOS transistor and a selecting MOS transistor for each group of the photodiodes. One pixel unit is provided with plural photodiodes (N-diffusion layers) and plural independent FD regions, and includes plural pixels. The well contact is not provided between the photodiodes within a unit but provided between the photodiodes belonging to adjacent units.

Figure 5:
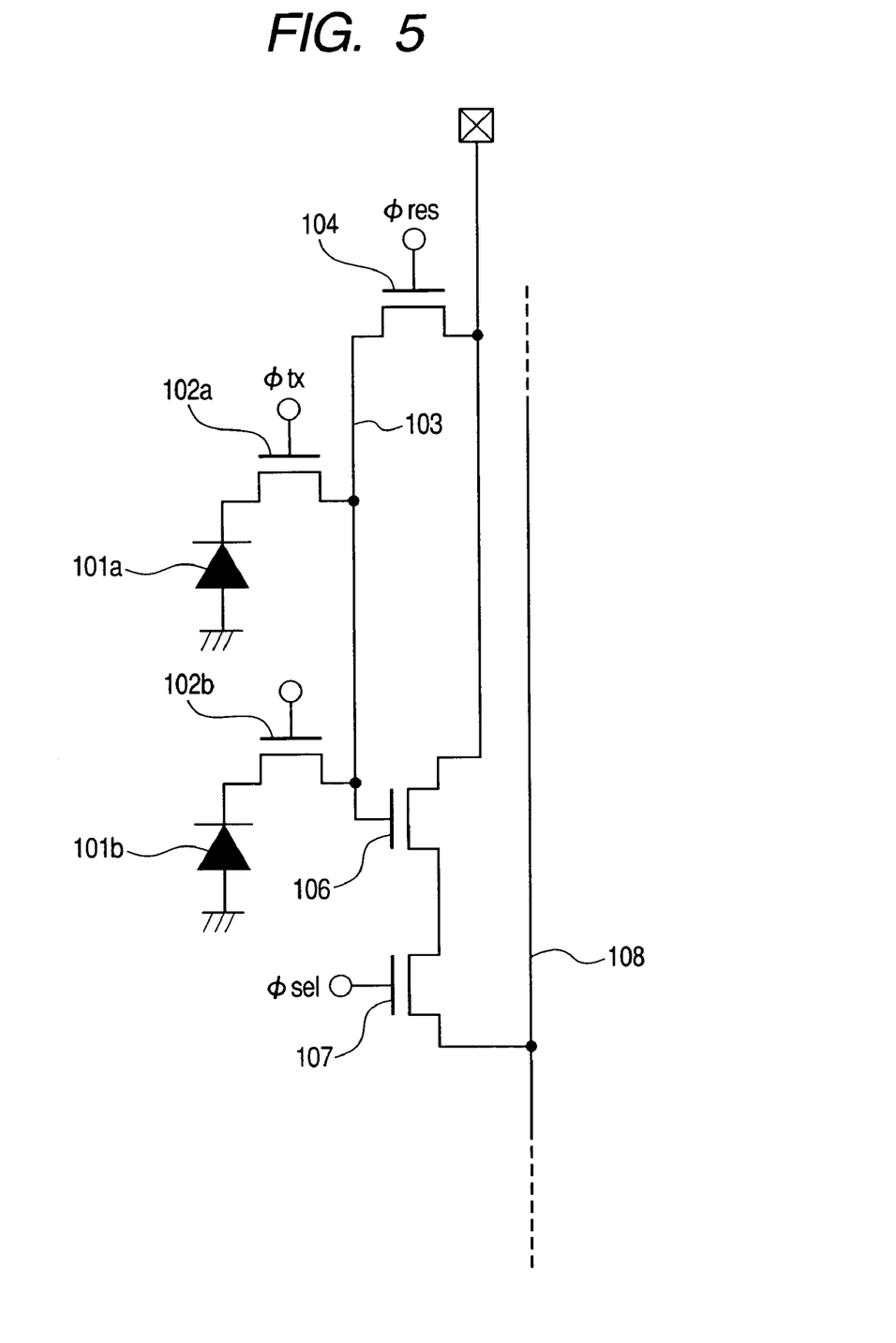
FIG. 5 is an equivalent circuit diagram of a pixel unit, represented by a broken line in FIG. 4.

FIG. 5 is an equivalent circuit diagram of the pixel unit surrounded by a broken line in FIG. 4. In FIG. 5, 101a and 101b do not indicate the diffusion regions but photodiodes themselves, and 102a, 102b, 104, 106 and 107 do not indicate the gate electrodes but respectively indicate a transfer MOS transistor, a reset MOS transistor, an amplifying MOS transistor and a selecting MOS transistor themselves. Photodiodes 101a, 101b are connected to FD regions, respectively through transfer MOS transistors 102a, 102b. A backgate potential of all the transistors and anode electrodes of the photodiodes are fixed to a constant potential, such as a ground potential, through the well contact 109. Also a drain of the reset transistor 104 and a drain of the source follower amplifier are fixed to the power supply voltage through a via hole.

FIG. 1 corresponds to a cross section along line 1-1 in FIG. 4. The cross-sectional configuration along line 1-1 in FIG. 4 is similar to that of the above-described first embodiment, and the explanation will be omitted in such similar portions.

As to a potential between the well contact (diffusion region) and the photodiode, the shape of the potential becomes different, due to a difference in the work functions of the gate electrode material and the well, in the portions B and C in FIG. 1, between a case where the gate electrode is present and a case where the gate electrode is absent. Because of this fact, the diffusion of the minority carriers from the well contact to the photodiode is varied, though slightly.

By providing gate electrodes between the well contact and the respective photodiodes as shown in the present embodiment, it is rendered possible to obtain uniform diffusion of the minority carriers to the odd row and to the even row, thereby realizing a solid-state image pickup apparatus without unevenness in the dark currents.

The dark currents can be made more uniform in case the distances between the $P^+$-diffusion region 306 and the diffusion regions 101b and 101a are mutually same.

A pixel in the present embodiment includes a photodiode (N-diffusion region), a transfer MOS transistor, an amplifying MOS transistor, a reset MOS transistor, and a selecting MOS transistor, and the amplifying MOS transistor is used in common for plural photodiodes and plural transfer MOS transistors. However, the pixel is not limited to such configuration and each transistor is not limited to a MOS transistor, and there can also be employed VMIS (threshold voltage modulation image sensor), BCAST (buried charge accumulator and sensing transistor array) or LBCAST (lateral buried charge accumulator and sensing transistor array). In particular, BCAST or LBCAST can be realized without a substantial change, by replacing a JFET transistor with an amplifying MOS transistor. Also a sensor of a type, in which a signal charge accumulated in a photoelectric conversion portion is guided to a control electrode of a transistor provided in the pixel and an amplified signal is outputted from a main electrode, may be employed in the pixel of the present embodiment. There can also be utilized an SIT image sensor utilizing an SIT as the amplifying transistor (A. Yusa, J. Nishizawa et al., "SIT image sensor: Design consideration and characteristics", IEEE trans., Vol. ED-33, pp. 735-742, June 1986), BASIS utilizing a bipolar transistor (N. Tanaka et al., "A 310K pixel bipolar imager (BASIS)", IEEE Trans. Electron Devices, vol. 35, pp. 646-652, May 1990), or AMI (Amplified MOS Intelligent Imager (Nakamura et al., "Amplified solid-state image element AMI (Amplified MOS Intelligent Imager)", Bulletin of Television Society, 41, 11, pp. 1085-1082, November 1987). Also the arrangement of the photoelectroc conversion elements may assume a honeycomb structure.

EXAMPLE 2

Figure 6:
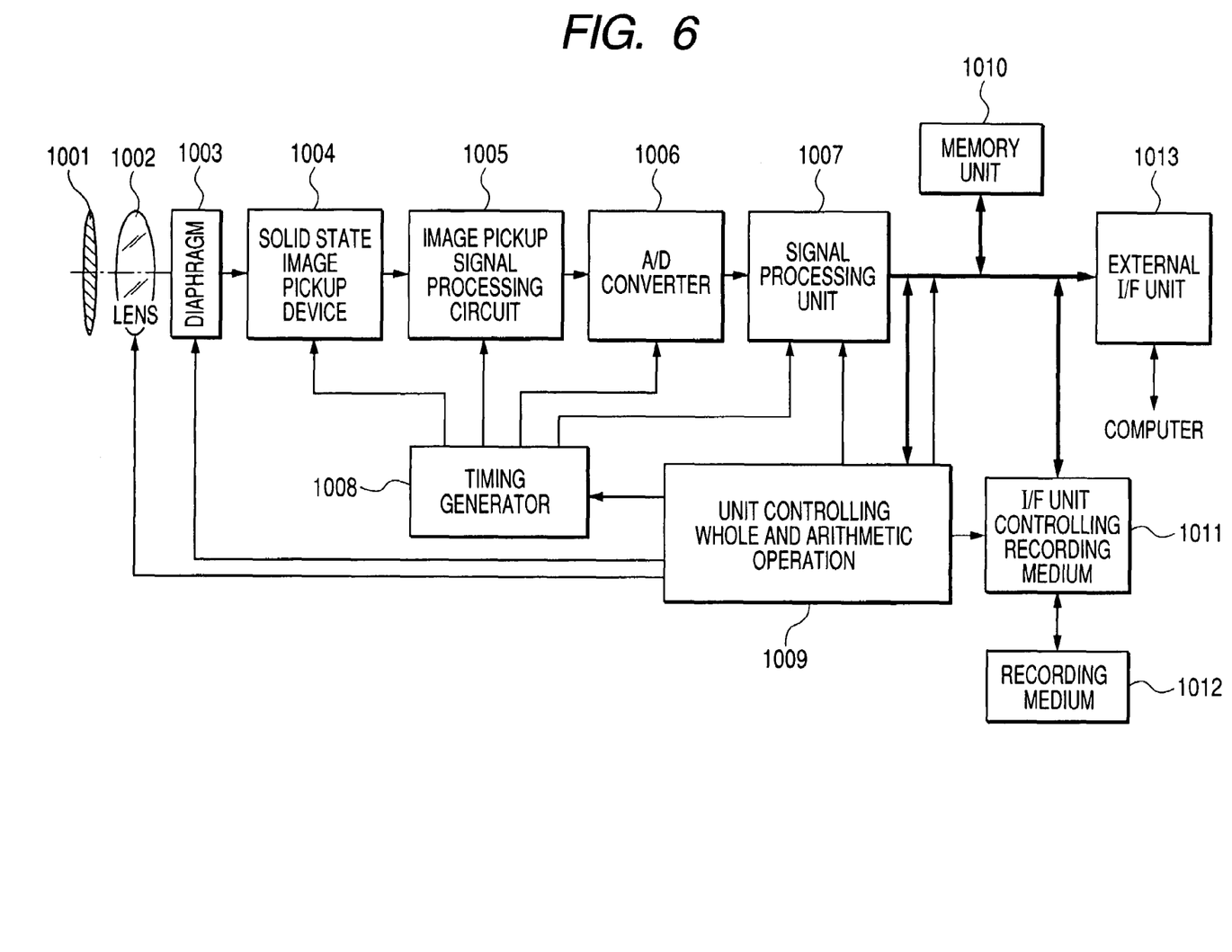
FIG. 6 is a configurational view employing, as a solid-state image pickup apparatus of the present invention, a solid-state image pickup apparatus utilizing a photoelectric conversion apparatus of the embodiments or a solid-state image pickup apparatus of Example 1.

FIG. 6 shows a configuration of a solid-state image pickup system of the present invention, in case of employing a solid-state image pickup apparatus utilizing the photoelectric conversion apparatus of the aforementioned embodiments or a solid-state image pickup apparatus of Example 1. The image pickup system is constituted of a barrier 1001 serving for lens protection and as a main switch; a lens 1002 for focusing an optical image of an object on a solid-state image pickup device 1004; a diaphragm 1003 for varying a light amount passing through the lens 1002; a solid-state image pickup device 1004 for fetching the object, focused by the lens 1002, as an image signal (corresponding to a solid-state image pickup apparatus including a photoelectric conversion apparatus explained in the foregoing embodiments or a solid-state image pickup apparatus of Example 1); an image pickup signal processing circuit 1005 for executing various corrections and a clamping on the image signal outputted from the solid-state image pickup device 1004; an A/D converter 1006 for executing an analog/digital conversion on the image signal outputted from the solid-state image pickup device 1004; a signal processing unit 1007 for executing various corrections and a data compression on the image data outputted from the A/D converter 1006; and a timing generator 1008 for outputting various timing signals to the solid-state image pickup device 1005, the image pickup signal processing circuit 1005, the A/D converter 1006 and the signal processing unit 1007. The circuits 1005-1008 may be formed on the same chip of the solid-state image pickup device 1004. The solid-state image pickup system further includes a whole-control/arithmetic operation unit 1009 for executing various calculations and controlling the entire still video camera; a memory unit 1010 for temporarily storing image data; a recording medium control interface 1011 for executing a recording or a readout into or from the recording medium; a detachable recording medium 1012 such as a semiconductor memory for data recording or readout; and an external interface (I/F) for communication with an external computer or the like.

In the following there will be explained operations of the system shown in FIG. 6. When the barrier 1001 is opened, a main power supply is turned on, then a power supply for the control system is turned on and a power supply for the image pickup circuits such as the A/D converter 1006 is turned on. Then, in order to control an exposure amount, the whole-control/arithmetic operation unit 1009 fully opens the diaphragm 1003, and a signal outputted from the solid-state image pickup device 1004 is passed through the image pickup signal processing circuit 5 and outputted to the A/D converter 1006. The A/D converter 1006 executes an A/D conversion on the signal for supply to the signal processing unit 1007. Based on such data, the signal processing unit 1007 calculates an exposure amount by the whole-control/arithmetic operation unit 1009.

A luminance is judged from the result of such light metering, and the whole-control/arithmetic operation unit 1009 controls-the diaphragm 1003 based on such result. Then, based on the signal outputted from the solid-state image pickup device 1004, the whole-control/arithmetic operation unit 1009 extracts a high-frequency component and calculates a distance to the object. Thereafter it drives the lens 1002 and judges whether it is in an in-focus state, and, if not in focus, it again drives the lens 1002 and executes a distance calculation.

Then a main exposure is initiated after an in-focus state is confirmed. When the exposure is completed, an image signal outputted from the solid-state image pickup device 1004 is subjected to a correction in the image pickup signal processing circuit 1005, then to an A/D conversion by the A/D converter 1006, then passed by the signal processing unit 1007 and accumulated by the whole-control/arithmetic operation unit 1009 in the memory unit 1010. Then the data accumulated in the memory unit 1010 are passed, under the control of the whole-control/arithmetic operation unit 1009, by the recording medium control I/F 1011 and recorded in the detachable memory medium 1012 such as a semiconductor memory. The data may also be supplied through the external I/F 1013 directly to a computer or the like for image processing.

The present invention is applicable to a solid-state image pickup apparatus, and a solid-state image pickup system utilizing the same, such as a digital camera, a video camera, a copying apparatus or a facsimile apparatus.

This application claims priority from Japanese Patent Application No. 2004-254361 filed on Sep. 1, 2004, which is hereby incorporated by reference herein.

What is claimed is:

1. An image pickup apparatus comprising:
    a plurality of a photoelectric conversion element having a first semiconductor region of a first conductive type, a plurality of second semiconductor regions of a second conductive type forming a junction with the first semiconductor region, a third semiconductor region of a first conductive type, provided in the first semiconductor region between mutually adjacent second semiconductor regions;
    an element isolation region respectively provided between the third semiconductor region and each of the mutually adjacent second semiconductor regions; and
    a conductive layer provided on each element isolation region.

2. An image pickup apparatus according to claim 1, wherein distances between the third semiconductor region and the adjacent second semiconductor regions are the same.

3. An image pickup apparatus according to claim 1, wherein the third semiconductor region is provided for fixing a potential of the first semiconductor region.

4. An image pickup apparatus according to claim 1, wherein the conductive layers provided on the respective element isolation regions are formed by a same layer.

5. An image pickup apparatus according to claim 3, wherein the second semiconductor regions are arranged one-dimensionally or two-dimensionally, in which the plural second semiconductor regions arranged along a direction form a group by each predetermined number, and the third semiconductor region is provided for each group; and
    the third semiconductor region is provided in the first semiconductor region between the second semiconductor regions which are at least partially adjacent in the group.

6. An image pickup apparatus according to claim 3, wherein the second semiconductor regions are arranged one-dimensionally or two-dimensionally, in which the plural second semiconductor regions arranged along a direction form a group by each predetermined number; and the third semiconductor region is provided in the first semiconductor region between the second semiconductor region in a first group and the second semiconductor group in a second group, adjacent to the second semiconductor in the first group.

7. An image pickup apparatus according to claim 6, further comprising:

a floating diffusion region provided for each photoelectric device;

a transfer transistor provided for each second semiconductor region for transferring carriers accumulated in each second semiconductor region to the floating diffusion region;

an amplifying transistor of which a gate electrode is connected to the floating diffusion region;

a selecting transistor connected with the amplifying transistor; and a reset transistor for resetting at least the floating diffusion region;

wherein the conductive layer provided on each element isolation region is formed by a gate electrode of the transfer transistor, a gate electrode of the amplifying transistor, a gate electrode of the selecting transistor, or a gate electrode of the reset transistor.

8. An image pickup apparatus according to claim 7, wherein the amplifying transistor is provided in common for a group.

9. A solid-state image pickup system comprising:

an image pickup apparatus according to claim 1;

an optical system for focusing light onto the solid-state image pickup apparatus; and a signal processing circuit for processing an output signal from the solid-state image pickup apparatus.

* * * * *